United States Patent [19]

Bertenshaw et al.

[11] Patent Number: 4,933,804
[45] Date of Patent: Jun. 12, 1990

[54] INTERFERENCE SUPPRESSION FOR SEMI-CONDUCTING SWITCHING DEVICES

[75] Inventors: David R. Bertenshaw, Lightwater; John Wright, Barnes; Edwin P. Lockwood, Addlestone, all of England

[73] Assignee: The Rank Organisation PLC, London, England

[21] Appl. No.: 185,149

[22] Filed: Apr. 22, 1988

Related U.S. Application Data

[63] Continuation of Ser. No. 692,393, Jan. 18, 1985, abandoned.

[30] Foreign Application Priority Data

Jan. 19, 1984 [GB] United Kingdom ............... 8401388

[51] Int. Cl.⁵ .............................................. H02H 3/22
[52] U.S. Cl. .................................. 361/111; 361/388; 361/56
[58] Field of Search ............... 361/18, 54, 56, 42–50, 361/91, 111, 113, 119, 118, 386, 388, 395, 399; 439/507; 174/51, 52 R; 307/90, 107, 108; 323/327, 905

[56] References Cited

U.S. PATENT DOCUMENTS

| | | |
|---|---|---|
| 1,664,494 | 4/1928 | Smith . |
| 2,498,824 | 2/1950 | Rady . |
| 3,204,201 | 8/1965 | Bahrs ........................... 174/51 |
| 3,211,922 | 10/1965 | Gregory et al. ................ 351/386 |
| 3,395,318 | 7/1968 | Laermer et al. . |
| 3,439,255 | 4/1969 | Carnes et al. ................ 361/388 X |
| 3,683,271 | 8/1972 | Kobayashi . |
| 3,829,598 | 8/1974 | Darnell . |
| 4,161,016 | 7/1979 | Born et al. .................... 361/388 |
| 4,175,811 | 11/1979 | Coldren et al. ................ 439/507 |
| 4,178,617 | 12/1979 | Reichel . |
| 4,376,287 | 3/1983 | Sechi . |
| 4,409,641 | 10/1983 | Jakob et al. ................... 361/399 X |
| 4,449,292 | 5/1984 | Kaufman ...................... 361/395 X |
| 4,520,425 | 5/1985 | Ito . |
| 4,554,608 | 11/1985 | Block ........................... 361/119 |
| 4,561,011 | 12/1985 | Kohara et al. . |
| 4,621,304 | 11/1986 | Oogaki et al. ................. 361/388 X |
| 4,698,721 | 10/1987 | Warren ......................... 361/111 X |

FOREIGN PATENT DOCUMENTS

| | | |
|---|---|---|
| 0018174 | 10/1980 | European Pat. Off. . |
| 879449 | 2/1943 | France . |
| 1390177 | 4/1975 | United Kingdom . |

OTHER PUBLICATIONS

Patents Abstracts of Japan, vol. 6, No. 55 (E-101) (933), Apr. 10, 1982, JP-A-56-169355, Mitsubishi Denki, Dec. 26, 1981.
IBM Disclosure, "Integrated Circuit Package and Heat Sink", vol. 13, No. 1, Jun. 1970.
IBM Disclosure, "Chip Attachment Structure for High Performance, Efficiently Cooled Semiconductor Chip Carriers", vol. 25, No. 5, Oct. 1982.

Primary Examiner—William M. Shoop, Jr.
Assistant Examiner—A. Jonathan Wysocki

[57] ABSTRACT

An electrical unit such as a lighting dimmer pack incorporating one or more semi-conducting switching devices such as triacs or thyristors, wherein the usual insulated mounting base (18) of the triac (30) is in turn mounted on the unit casing via an electrically insulating heat conductor, and the said mounting base is connected to the phase or neutral conductor (52), preferably the latter. In a preferred arrangement, a plurality of triacs are clamped by a printed circuit board which provides the connection from the triac bases to the neutral conductor.

17 Claims, 2 Drawing Sheets

4,933,804

INTERFERENCE SUPPRESSION FOR SEMI-CONDUCTING SWITCHING DEVICES

This is a continuation, of application Ser. No. 06/692,393, filed January 18, 1985, (now abandoned).

This invention relates to a method of reducing interference produced by a semi-conducting switching device and also to an interference suppressing electrical unit incorporating such a device.

BACKGROUND OF THE INVENTION

In the design of units incorporating semi-conducting switching devices such as thyristor and triac lighting dimmers, there are two subject matters with which international regulations are primarily concerned. The first is a limit on the radio frequency interference generated by the dimmer and this is enforced through many countries of the world. These regulations set limits on the amount of interference which the dimmer may generate on both the incoming and outgoing phase and neutral wires (and any other wires) of the dimmer, with respect to the earth conductor for the system.

Since a thyristor or triac dimmer, by nature of its switching action, normally generates an amount of interference well in excess of the regulation requirements, means have to be provided to suppress the interference. In particular, these means must ensure that the interference is not generated with respect to the earth, or alternatively that any such interference generated with respect to the earth is suppressed by use of a large value capacitor connected between earth and neutral and between neutral and phase. This effectively short circuits the noise current.

Unfortunately, there are other regulations concerned with the safety of electrical equipment and particularly the safety of portable electrical equipment. These further regulations concern themselves, amongst other things, with the safety of the earthing system provided and require that no more than a limited amount of leakage current may flow from the portable equipment phase or neutral to earth. This ensures that should the earth conductor to the unit fail, the current which may flow through human contact is limited to a safe level.

Since in many countries phase and neutral may be interchanged due to the use of reversible domestic connectors, the leakage current requirement is stipulated from neutral to earth with a 240 V potential difference (i.e. as if neutral was phase). This current is limited in some countries to 0.5 mA and thus sets a maximum value of suppression capacitance of about 6,600 pF, which is generally insufficient to absorb any serious amounts of injected noise current to earth at the lower end of the radio frequency spectrum (150-500 kHZ).

SUMMARY OF THE INVENTION

The object of the invention is to devise a means of utilising relatively inexpensive insulated based triacs and thyristors which have interference suppression networks added and, more especially, may be mounted on the earthed metal case of a portable dimmer pack, using the casing as a heatsink, without inducing any appreciable noise current from phase into the earth from the device due to the capacitance between the crystal of the device and the metal base.

Previously, either the regulations have essentially been ignored allowing either the interference to rise above the limit imposed by the regulations, or to allow the leakage current to exceed regulation limited currents, as in many countries of the world the regulations are not enforced by a certification requirement prior to marketing. Alternatively it has been proposed to overcome the problem by mounting the triac or thyristor on a separate isolated heatsink adequately spaced away from the earthed casing. However, this inevitably increases the cost of the product both due to the extra parts required and due to the requirement to fix the heatsink inside the casing, so that the casing then requires extra ventilating means.

According to one aspect of the present invention, there is provided a method of reducing interference produced by a semi-conducting switching device according to which the device is provided with a conductive mounting base insulated from the device terminals, the mounting base is, via a heat conductive insulator, attached to but insulated from an earthed structure which acts as a heat sink, and the mounting base is electrically connected to a phase or neutral conductor to enable said conductor to act as an electrical screen for the device.

Conveniently, a common mounting assembly may be employed for a plurality of switching devices, e.g. as are normally provided in a dimmer pack. Such a common mounting assembly can conveniently have a single connection to the neutral or common phase conductor.

Thus, in a preferred method, the single connection is effected by clamping the devices to a printed circuit board with the mounting bases in electrical contact with the printed circuit, the said printed circuit being electrically connected to the neutral conductor.

According to another aspect of the invention, there is provided an interference suppressing electrical unit incorporating a semi-conducting switching device, comprising a conductive mounting base for the device, insulated from the device terminals, a structure for acting as a heatsink and connected to earth, means attaching the mounting base to the structure via a heat conductive insulator, and means connecting the mounting base to the phase or neutral conductor of the unit.

In a practical unit, the phase and neutral conductors of the unit are connected on the input side of the switching device by an interference suppression capacitor, and the mounting base is connected to the neutral conductor.

This practical unit, such as a dimmer pack, may include a common mounting assembly for the mounting bases of a plurality of switching devices, and a common electrical connection from said mounting assembly to the neutral conductor. Preferably, this mounting assembly comprises a printed circuit board, and the switching devices are clamped by the said board to the said structure with their mounting bases in electrical contact with the printed circuit on the board, said printed circuit being connected to the neutral conductor.

In practice, the said structure connected to earth may be a conductive casing or housing for said switching device or plurality of devices.

BRIEF DESCRIPTION OF THE DRAWINGS

The invention will now be explained and exemplified with reference to the accompanying drawings, in which.

DETAILED DESCRIPTION OF THE ILLUSTRATED EMBODIMENTS

Figure 1:
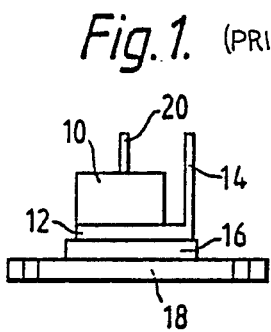
FIG. 1 shows a typical conventional internal construction for a triac switching device.

A typical internal construction of an insulated base triac is shown in FIG. 1. The crystal 10 is mounted on a metal conductor 12 integral with the main terminal 14 and the whole is then further mounted on a ceramic insulator 16, then a metal mounting base 18. The other main terminal is referenced 20. This device exhibits good thermal conductivity from the heat-producing crystal 10 through to the metal base 18, which then allows the heat to be dissipated into the structure to which the base 18 is connected. It is to be noted that the construction leads to generation of a small but significant capacitance, shown as capacitor 40 in FIGS. 2, 3, and 5,; between terminal 14 and the metal base 18, which is typically of the order of 20–30 pF.

Figure 2:
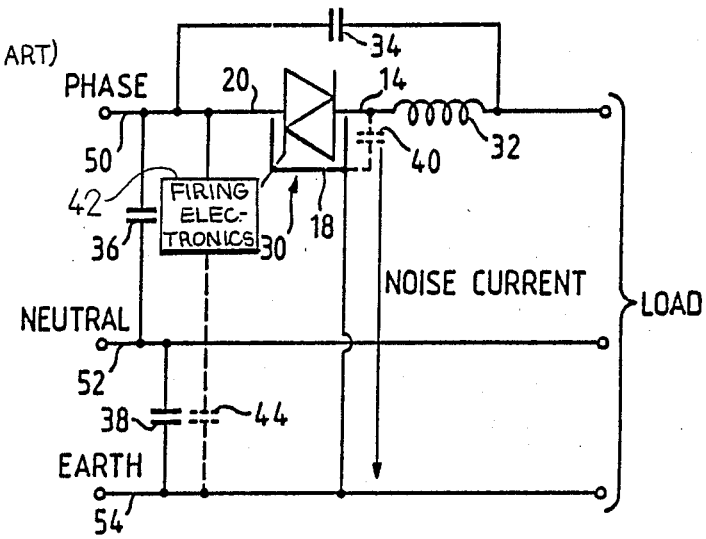
FIG. 2 shows a circuit for a triac dimmer, including components intended for interference suppression.

In FIG. 2 is shown a circuit for a triac dimmer, including interference suppression components. The triac 30 has a suppression choke 32 connected in series and the triac/choke assembly is shunted by a suppression capacitor 34. The phase and neutral conductors, respectively 50, 52, have a suppression capacitor 36 between them, which capacitor serves to equalise and marginally reduce the interference of the pair, and a much smaller capacitor 38 is connected between neutral 52 and earth 54. For practical purposes, this capacitor 38 is limited to 4,700 pF due to the second aforementioned regulations.

Interference can be measured by connecting an interference meter between earth and phase and between earth and neutral, both on the input side and on the load side. In spite of inclusion of the interference suppression components, interference exceeds limits set by the first aforementioned regulations. This interference problem is mainly caused by the parasitic capacitor 40 between the triac base 18 and terminal 14, coupling noise current from the output of the triac, before suppression by the choke 32, into earth, assuming the triac base 18 to be directly mounted on the earthed metal case (not shown) of the unit.

A means of eliminating the noise current would be to reverse the connection of the triac and the circuit such that the parasitic capacitor 40 was instead connected to the incoming phase and therefore not a source of noise. However, the firing electronics 42 for the unit also inevitably carries an unavoidable intrinsic capacitance to earth, as indicated in broken line at 44, and would similarly cause a noise current to be induced to earth through the output of the triac.

Figure 6:
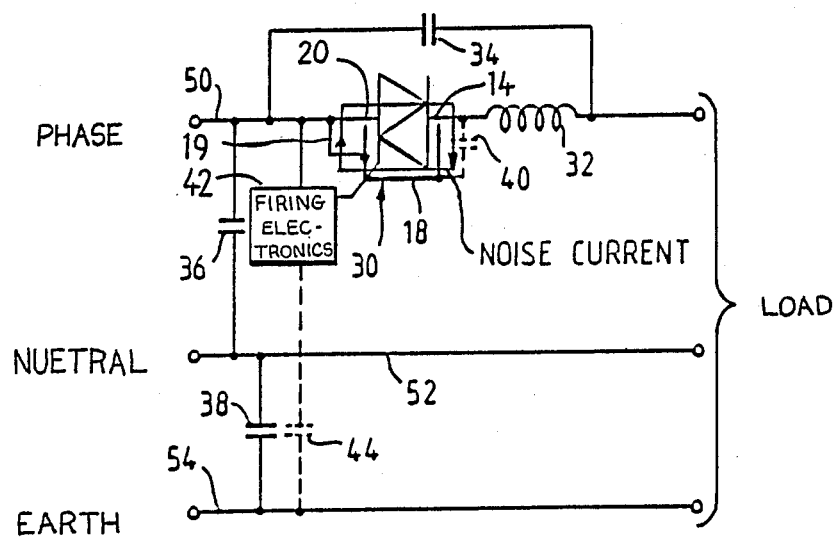
FIG. 6 shows a triac taken on line 5—5 dimmer circuit in accordance with another embodiment of the invention showing the casing to which the semi-conducting devices are mounted, in section.

One possible solution to the problem, within the compass of the present invention, is for the insulated base 18 of the triac to be separated from the metal casing of the product by a further heat conducting insulator, and the base connected as shown by connection 19 in FIG. 6 to the phase conductor 50. This has a cost disadvantage in that each triac in a pack such as a dimmer pack has to be connected separately to its incoming phase and no common bussing structure is readily conceivable.

Figure 3:
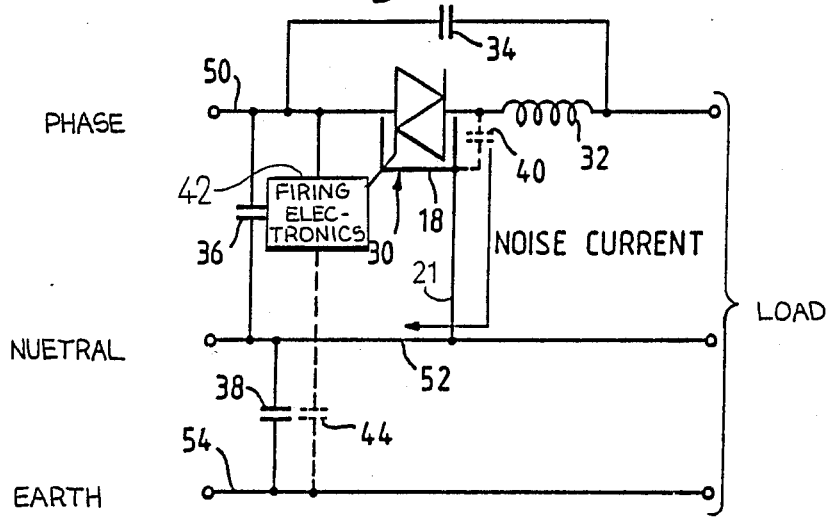
FIG. 3 shows a triac dimmer circuit in accordance with the invention.

A preferred solution in accordance with the invention is shown in FIG. 3, wherein similar reference numerals are employed to those used in FIG. 2. Here, the triac base 18 is connected through connection 2 to neutral 52, so that the noise current is effectively short-circuited through the large capacitor suppression 36. This has the further benefit that all the triacs in the multiple dimmer pack can be connected together via one common mounting assembly, with the need for only one neutral connection.

Figure 4:
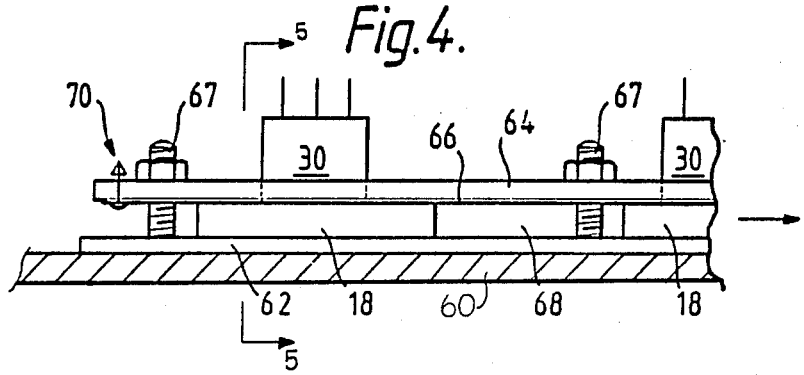
FIG. 4 is a fragmentary vertical elevation of a mounting assembly for a dimmer unit in accordance with the invention.
Figure 5:
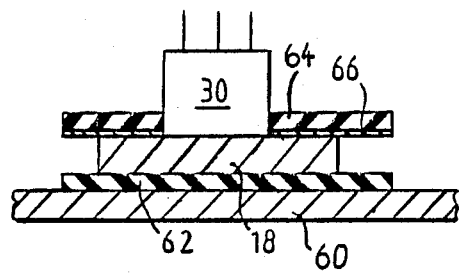
FIG. 5 is a vertical section through the mounting assembly and triacs of FIG. 4 showing the upper body of the triacs in elevation.

Such a mounting assembly is shown in FIG. 4 and FIG. 5, in relation to one triac of the multiplicity thereof. The triac 30 is mounted on the casing 60 via a heat conducting insulator 62. In order to ensure maximum thermal contact and to make a connection between the triac metal base 18 and neutral 52, the triac 30 is held clamped by a printed circuit board 64, with the copper laminate 66 on the underside held down against the triac base 18. The copper laminate 66 defining the printed circuit is etched so that clamping bolts 67 establish a requisite clearance 68 between the neutral conductor 52 and earth (casing 60), and so that said printed circuit connects all of the mounting bases 18 of the triacs held down by this method to neutral. The neutral connection to the printed circuit board 64, 66 is indicated at 70.

The above-described embodiment utilises triacs for economy; however, the method is equally appropriate for the mounting of thyristors, thyristor packs or other semi-conductor switching device. The invention may also be employed, more generally, in an electrical unit incorporating only a single semi-conducting switching device such as a triac or thyristor, for the purpose of effecting interference suppression to the level necessary to meet the aforementioned regulations.

We claim:

1. A method of reducing interference produced by a semi-conducting switching device having input and output terminals and provided with an electrically conductive mounting base insulated from the device terminals, and wherein the device is incorporated in a circuit having at least a phase conductor and a neutral conductor and the phase conductor is electrically connected to the input terminal of the switching device, comprising attaching the mounting base, via a heat conductive insulator, to an earthed structure whereby the mounting base is electrically insulated from the earthed structure which acts as a heat sink; electrically connecting the mounting base to the neutral conductor; and electrically coupling the neutral conductor to the phase conductor with a noise suppresion capcitor to provide substantially a short circuit between the two conductors for noise current to enable said mounting base to act as an electrical screen for the device.

2. A method according to claim 1, according to which a common mounting assembly is employed for a plurality of switching devices.

3. A method according to claim 2, according to which the common mounting assembly has a single connection to the neutral conductor.

4. A method according to claim 3, according to which the single connection is effected by clamping the devices to a printed circuit board having a printed circuit thereon with the mounting bases in electrical contact with the printed circuit, the said printed circuit being electrically connected to the neutral conductor.

5. An interference suppressing electrical unit incorporating a semi-conducting switching device having terminals, comprising a semi-conducting switching device having input and output terminals and an electrically conductive mounting base for the device electrically insulated from the device terminals; a structure acting as a heat sink and connected to earth; heat conductive electrical insulating means attaching the mounting base to the structure; a phase conductor connected to the input terminal of the semi-conducting switching device; a neutral conductor; means electrically connecting the mounting base to the neutral conductor; and a noise suppression capacitor connected between the phase and neutral conductors.

6. A unit according to claim 5, wherein the unit includes a plurality of semi-conducting switching devices, wherein the unit includes a common mounting assembly for mounting the bases of the plurality of switching devices; and wherein the unit includes a common electrical connector from said mounting assembly to the neutral conductor.

7. A unit according to claim 6, wherein the common mounting assembly comprises a printed circuit board having a printed circuit thereon, the switching devices are clamped by said board to the structure connected to earth with their mounting bases in electrical contact with the printed circuit on the board, and said printed circuit is connected to the neutral conductor.

8. A unit according to claim 7, wherein the switching devices each include a body portion and a mounting base extending across one end of the body portion and extending beyond the body portion, wherein the printed circuit board clamps the mounting bases to the structure with an electrically insulating heat conductive material sandwiched between the mounting bases and the structure, and wherein the printed circuit is in electrical contact with the mounting bases.

9. A unit according to claim 8, wherein the printed circuit board has openings therein, wherein the bodies of the switching devices extend through the openings in the printed circuit board, and wherein the printed circuit board contacts the mounting bases of the switching devices where they extend beyond the body portions to sandwich such mounting bases between the printed circuit board and the structure with the printed circuit on the printed circuit board in contact with the mounting bases.

10. A unit according to claim 5, wherein the unit is a part of electrical equipment enclosed in a conductive equipment case and wherein the structure acting as a heat sink and connected to earth is the conductive equipment case.

11. A unit according to claim 10, wherein the electrical equipment is a light dimmer.

12. A unit according to claim 5, wherein the switching device is a triac.

13. A unit according to claim 5, wherein the switching device is a thyristor.

14. A unit according to claim 5, wherein the unit is included as a part of a light dimmer.

15. A unit according to claim 5, wherein the unit additionally includes an inductor electrically connected in series with the output terminal of the semi-conducting switching device and a capacitor electrically connected in parallel with the series connection of the semi-conducting switching device and inductor.

16. An interference suppressing electrical unit incorporating a semi-conducting switching device having terminals, comprising a semi-conducting switching device having input and output terminals and an electrically conductive mounting base for the device electrically insulated from the device terminals; a structure acting as a heat sink and connected to earth; heat conductive electrical insulating means attaching the mounting base to the structure; a phase conductor connected to the input terminal of the semi-conducting switching device; and means electrically connecting the mounting base to the phase conductor connected to the input terminal of the semi-conducting switching device.

17. A method of reducing interference produced by a semi-conducting switching device having input and output terminals and provided with an electrically conductive mounting base insulated from the device terminals, and wherein the device is incorporated in a circuit having at least a phase conductor electrically connected to the input terminal of the switching device, comprising attaching the mounting base, via a heat conductive insulator, to an earthed structure whereby the mounting base is electrically insulated from the earthed structure which acts as a heat sink; and electrically connecting the mounting base to the phase conductor connected to the input terminal of the semi-conducting switching device to enable said mounting base to act as an electrical screen for the device.

* * * * *